(12) United States Patent
Lin

(10) Patent No.: US 6,299,468 B1
(45) Date of Patent: Oct. 9, 2001

(54) RETENTION MECHANISM FOR EDGE CARD

(75) Inventor: Yi Yan Lin, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/513,553

(22) Filed: Feb. 25, 2000

(30) Foreign Application Priority Data

Dec. 30, 1999 (TW) .................................................. 88222449

(51) Int. Cl.[7] .................................................. H01R 13/62
(52) U.S. Cl. .............................................................. 439/327
(58) Field of Search ................................... 439/325–328; 361/801

(56) References Cited

U.S. PATENT DOCUMENTS

| | | | |
|---|---|---|---|
| 3,829,741 | * | 8/1974 | Athey . |
| 4,507,707 | * | 3/1985 | Willis . |
| 4,869,680 | * | 9/1989 | Yamamoto et al. ................. 439/327 |
| 5,383,793 | * | 1/1995 | Hsu et al. ............................ 439/327 |
| 5,494,451 | * | 2/1996 | Bowers ................................ 439/328 |
| 5,822,193 | * | 10/1998 | Summers et al. ..................... 361/759 |
| 5,822,197 | * | 10/1998 | Thuault ............................... 439/327 |
| 5,943,218 | * | 8/1999 | Liu ...................................... 361/801 |

* cited by examiner

Primary Examiner—Gary F. Paumen
(74) Attorney, Agent, or Firm—Wei Te Chung

(57) ABSTRACT

A retention mechanism comprises a post and a movable arm slidingly secured to the post. The post includes a plurality of serrations formed along an elongated side thereof. The movable arm includes a canister adapted to enclose and latch with the serrations of the post, and a securing portion extending from the canister for securing an upper edge of an edge card. The canister forms a pair of stoppers in two opposite holes defined in an outside wall thereof. Each stopper includes a lever and two ribs supporting the lever in the sidewall of the canister. Each lever forms an inwardly extending protrusion thereon. When lower ends of the levers are pushed inwardly toward each other, the levers pivot about the ribs and the protrusions move outwards from the serrations of the post, allowing the movable arm to slide along the elongated side of the post. When the movable arm reaches a desired height corresponding to the height of the upper edge of the edge card, the lower ends of the levers are released, allowing the protrusions to move inwardly to latch with the serrations, thereby securing the edge card in place.

2 Claims, 9 Drawing Sheets

US 6,299,468 B1

RETENTION MECHANISM FOR EDGE CARD

BACKGROUND OF THE INVENTION

The present invention relates to a retention mechanism, and particularly to a retention mechanism for securing edge cards in a range of different heights.

U.S. Pat. Nos. 4,507,707; 4,869,680; and 5,822,193 each disclose a retention mechanism for securing an edge card onto a printed circuit board. However, a disadvantage of the retention mechanism of the U.S. Pat. No. 4,507,707 is that the movable post 80 thereof only abuts an upper edge of the edge card 14, so the securing relationship therebetween is not firm. The assembly of the retention mechanism of the U.S. Pat. No. 4,869,680 requires pressing a plurality of spring-biased balls into corresponding holes, making it relatively difficult to assemble. A disadvantage of the retention mechanism of the U.S. Pat. No. 5,822,193 is that the assembly of the retention mechanism is more difficult because of its complicated structure. Other U.S. Pat. Nos. 3,829,741, 5,494,451 and 5,943,218 also show some card retention devices for use with the card.

An attempt is proposed to use a bolt positioned beside the card, wherein the bolt has a movable arm with a clamp capable of moving upwardly and downwardly along the bolt and capable of clamping the upper edge of the card. However, a disadvantage of this retention mechanism is that manufacturing the screw threads increases the difficulty and the cost of manufacturing the mechanism, and possibly tends to be reversely rotated and loosened under severe vibration. Moreover, rotating the movable arm along the threads of the bolt during assembling or disassembling the card, takes labor and time.

Thus, a retention mechanism with a relatively simple structure and an efficient and reliable securing device is needed to facilitate the assembly process, reduce the cost of manufacturing and guarantee the locking effect.

BRIEF SUMMARY OF THE INVENTION

A main object of the present invention is to provide a retention mechanism with a simple structure capable of securing edge cards in a range of different heights.

To fulfill the above-mentioned object, a retention mechanism in accordance with the present invention used for securing edge cards with different heights comprises a post and a movable arm slidingly secured to the post. The post includes a plurality of serrations formed along an elongated side thereof and a metallic locking portion insert-molded within a lower end of the post for securing to a printed circuit board. The movable arm includes a canister for enclosing and latching with the serrations of the post, and a securing portion perpendicularly extending from an outside wall of the canister for clamping an upper edge of the edge card. The canister defines a pair of rectangular holes on opposite sides thereof. A pair of stoppers is formed in corresponding holes of the canister. Each stopper includes a lever extending along the elongated side of the post and two ribs supporting the lever in the sidewall of the canister, the ribs providing the levers a pivot to rotate about. Each lever forms a pushing end projecting outwardly on one end thereof and a protrusion projecting inwardly on an opposite end thereof. When the pushing ends are pushed inwardly toward each other, the protrusions move outwardly as the lever pivots about the ribs, moving out from between the serrations, allowing the movable arm to slide upwardly or downwardly along the elongated side of the post. When the canister reaches a height corresponding to the height of the upper edge of the edge card, the pushing ends are released to allow the protrusions to latch with the serrations, thereby firmly securing the edge card.

Other objects, advantages and novel features of the invention will become more apparent from the following detailed description when taken in conjunction with the accompanying drawings.

DETAILED DESCRIPTION OF THE INVENTION

Figure 1:
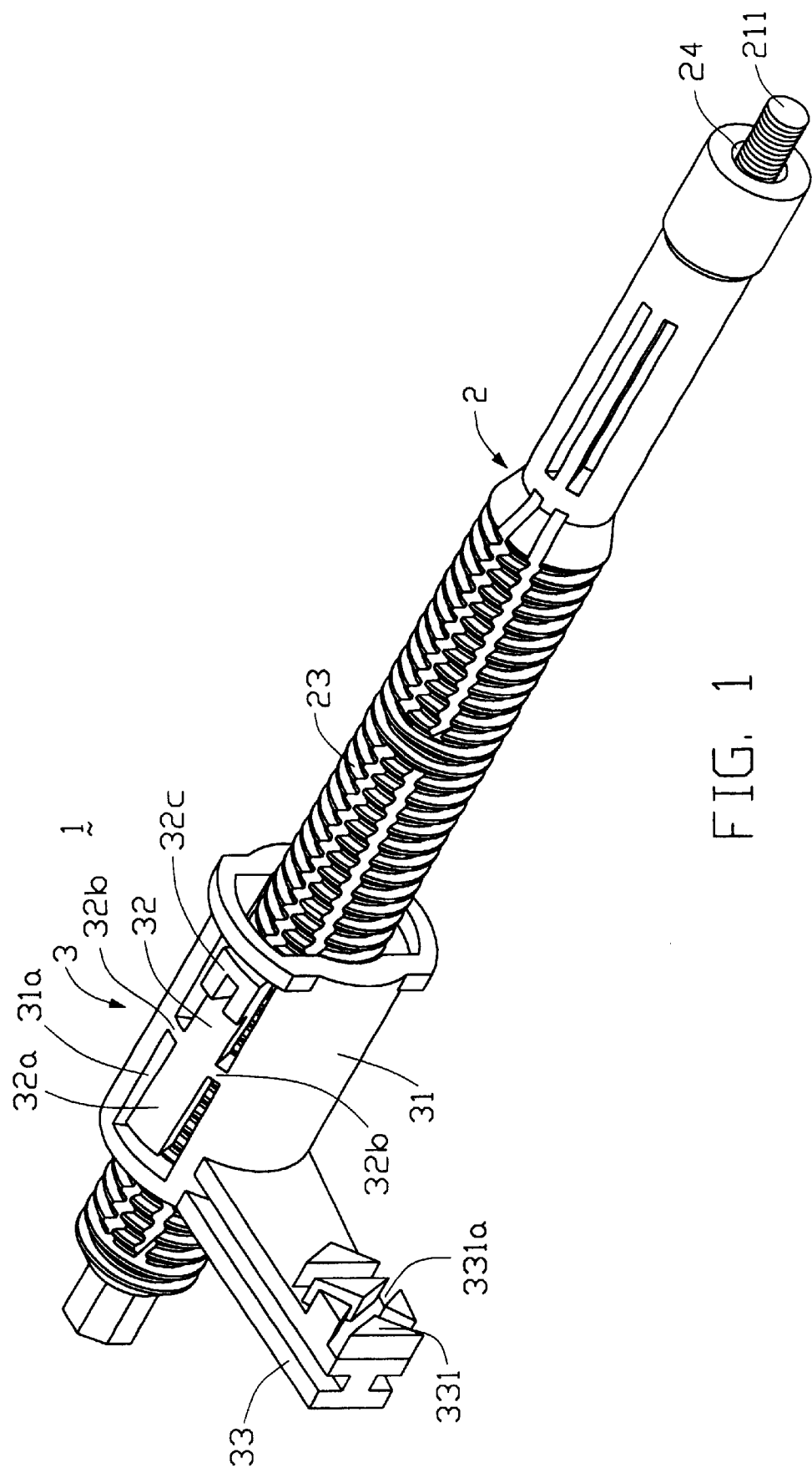
FIG. 1 is a perspective view of a retention mechanism for edge card in accordance with the present invention.
Figure 2:
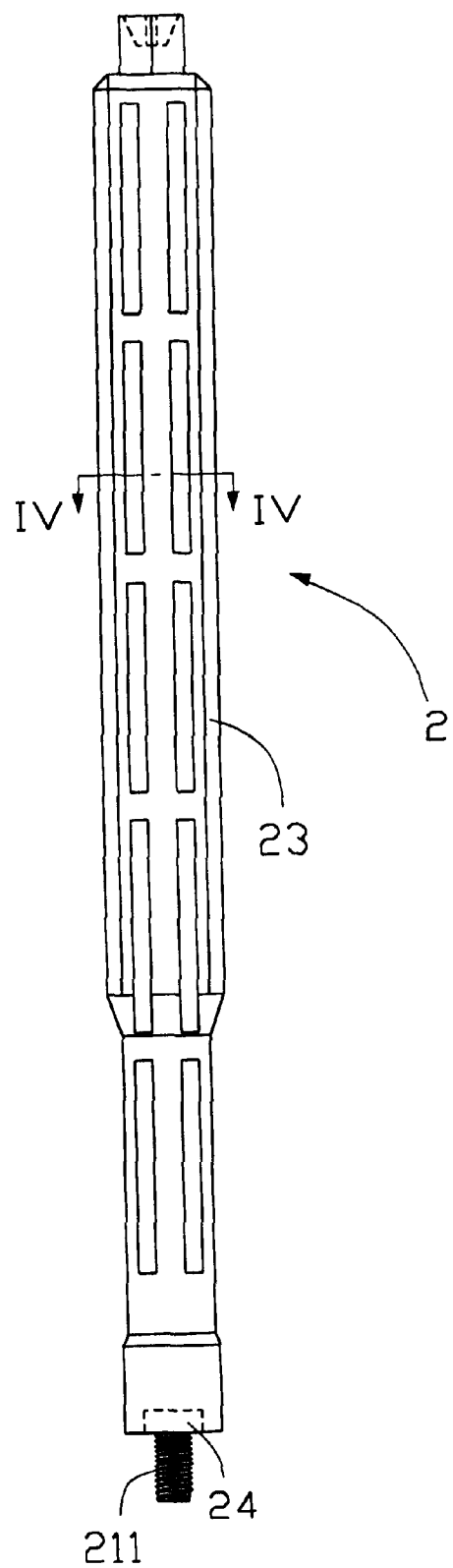
FIG. 2 is a front view of a post of FIG. 1.
Figure 3:
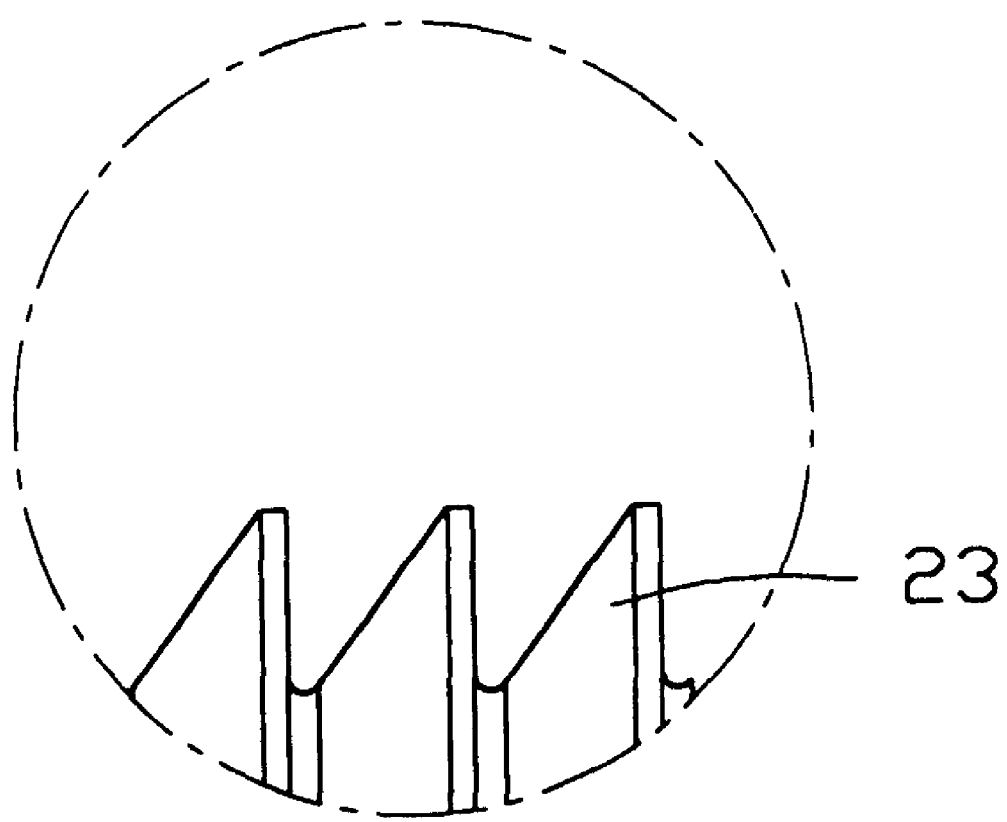
FIG. 3 is a partially enlarged view of the post of FIG. 2.
Figure 5:
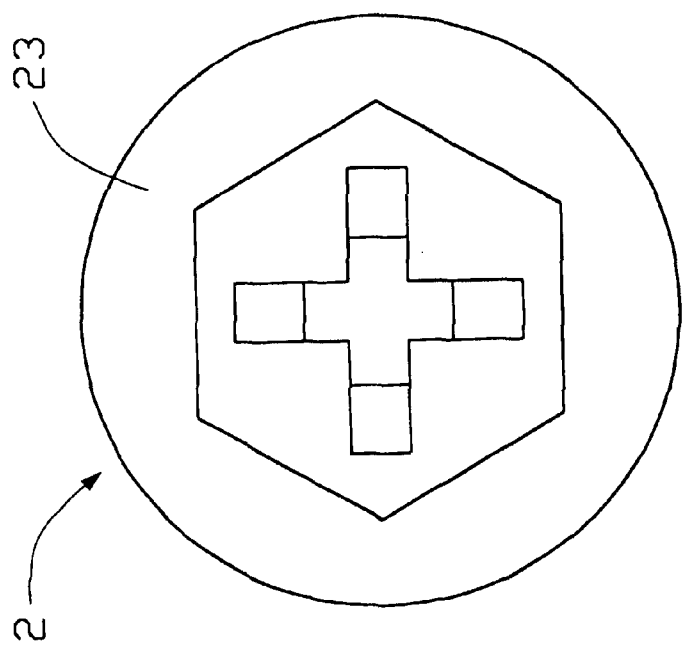
FIG. 5 is a top view of the post of FIG. 2.
Figure 4:
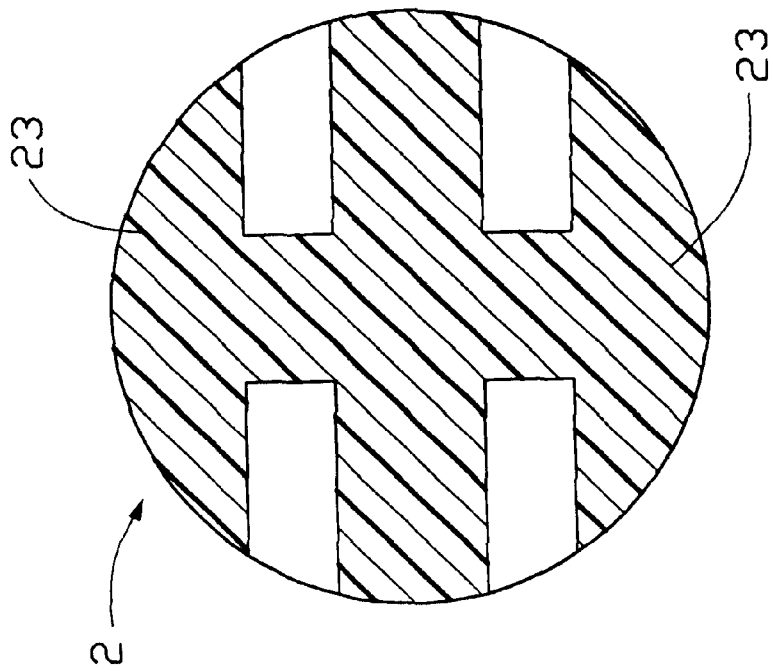
FIG. 4 is a cross-sectional view taken along line IV—IV of FIG. 2.
Figure 7:
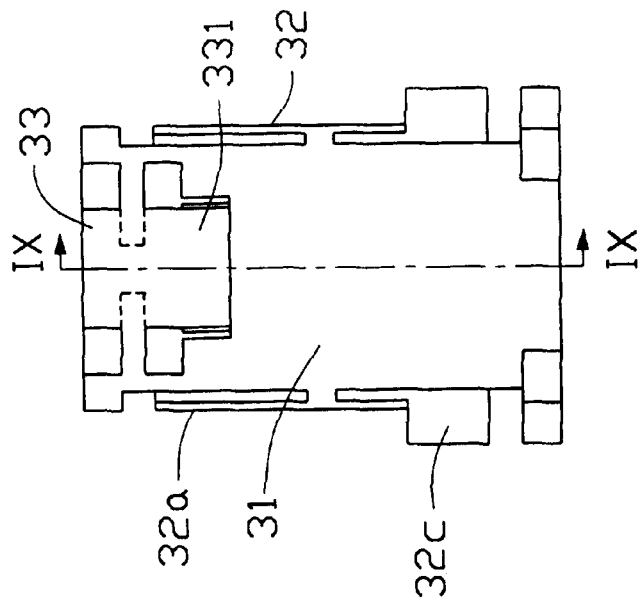
FIG. 7 is a left side view of FIG. 6.
Figure 6:
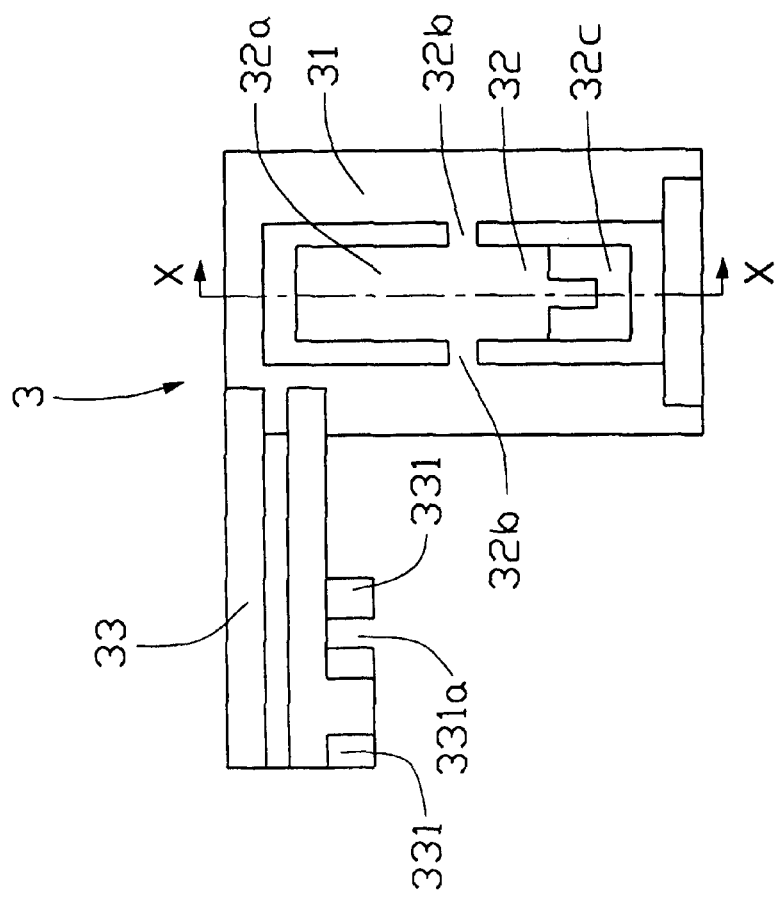
FIG. 6 is a front view of a movable arm of FIG. 1.
Figure 9:
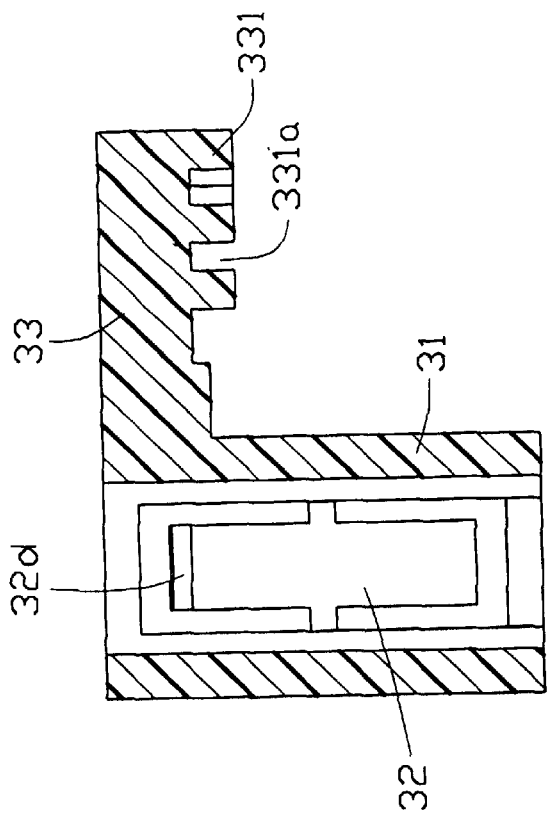
FIG. 9 is a cross-sectional view taken along line IX—IX of FIG. 7.
Figure 8:
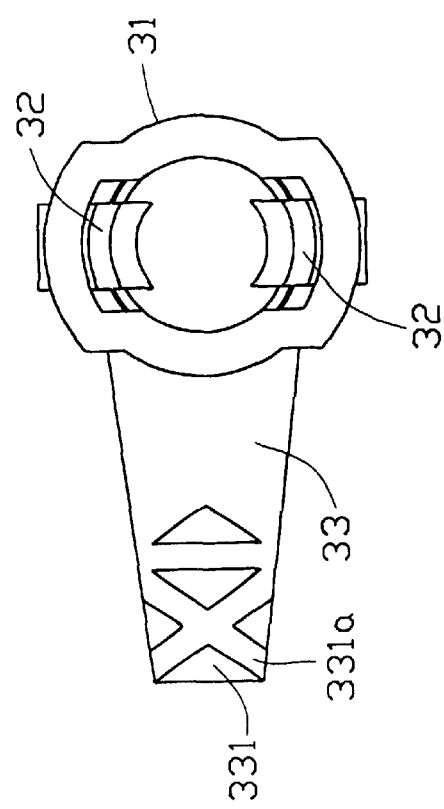
FIG. 8 is a bottom view of FIG. 6.
Figure 10:
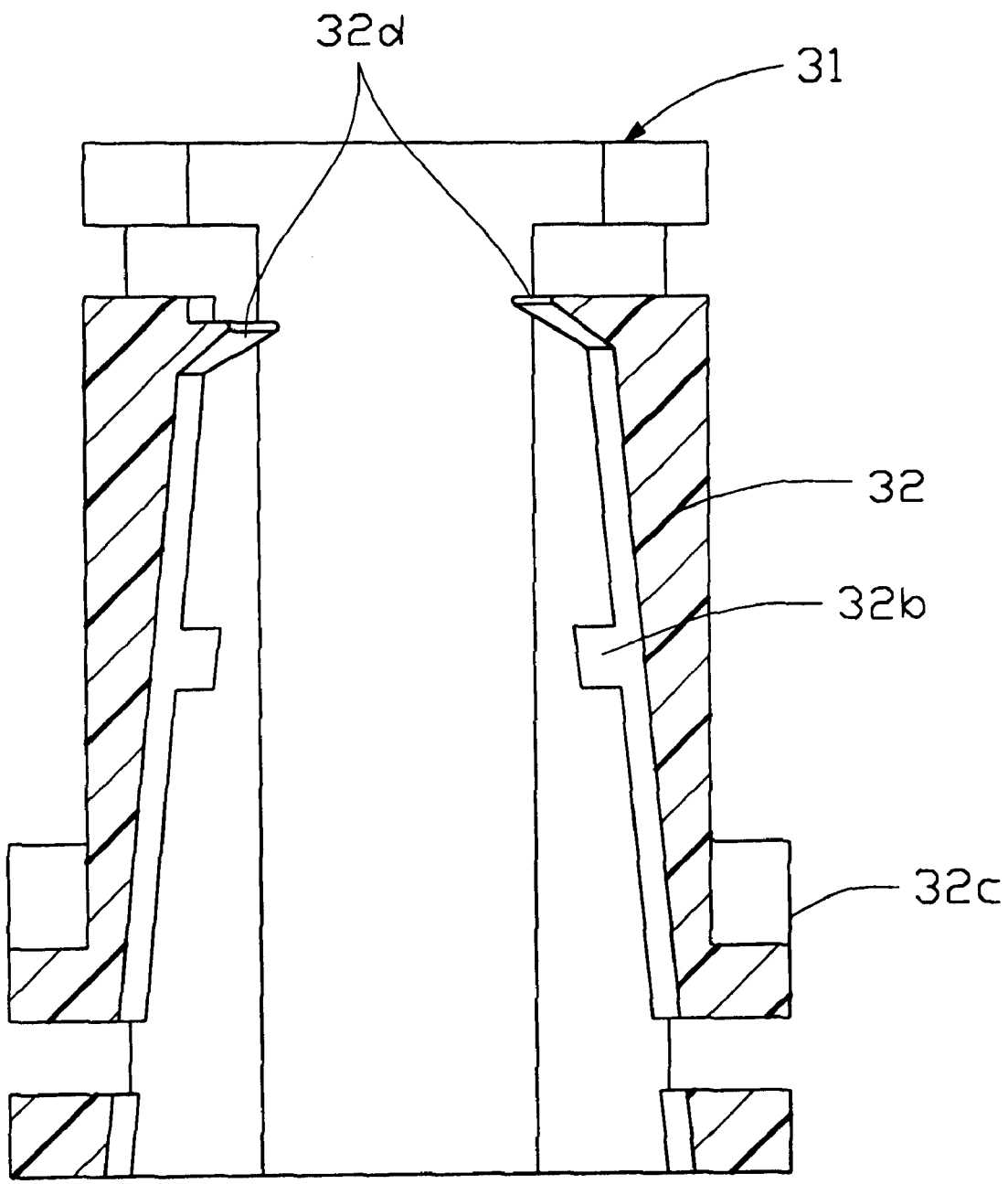
FIG. 10 is a cross-sectional view taken along line X—X of FIG. 6.

Referring to FIG. 1, a retention mechanism 1 in accordance with the present invention comprises an elongated post 2 for securing to a printed circuit board 6 (FIG. 12) and a movable arm 3 capable of sliding along an elongated side of the post 2 for securing an edge card having a height within a range of different heights.

Also referring to FIGS. 2 to 5, the post 2 includes a plurality of serrations 23 formed along the elongated side thereof, and a locking portion 211 secured within a lower end of the post 2 for securing into the printed circuit board 6. In the present invention, the locking portion 211 is a screw made of metal, and is insert-molded within the lower end of the post 2. In addition, the lower end of the post 2 defines a recess 24 along the longitudinal axis thereof which, having a radius larger than that of the locking portion 211, allows the lowest end of the post 2 to be distanced a short space from the locking portion 211, thereby preventing the rough edges which are usually generated in molding process from being formed on a bottom face (not labeled) of the lower end of the post 2.

Figure 12:
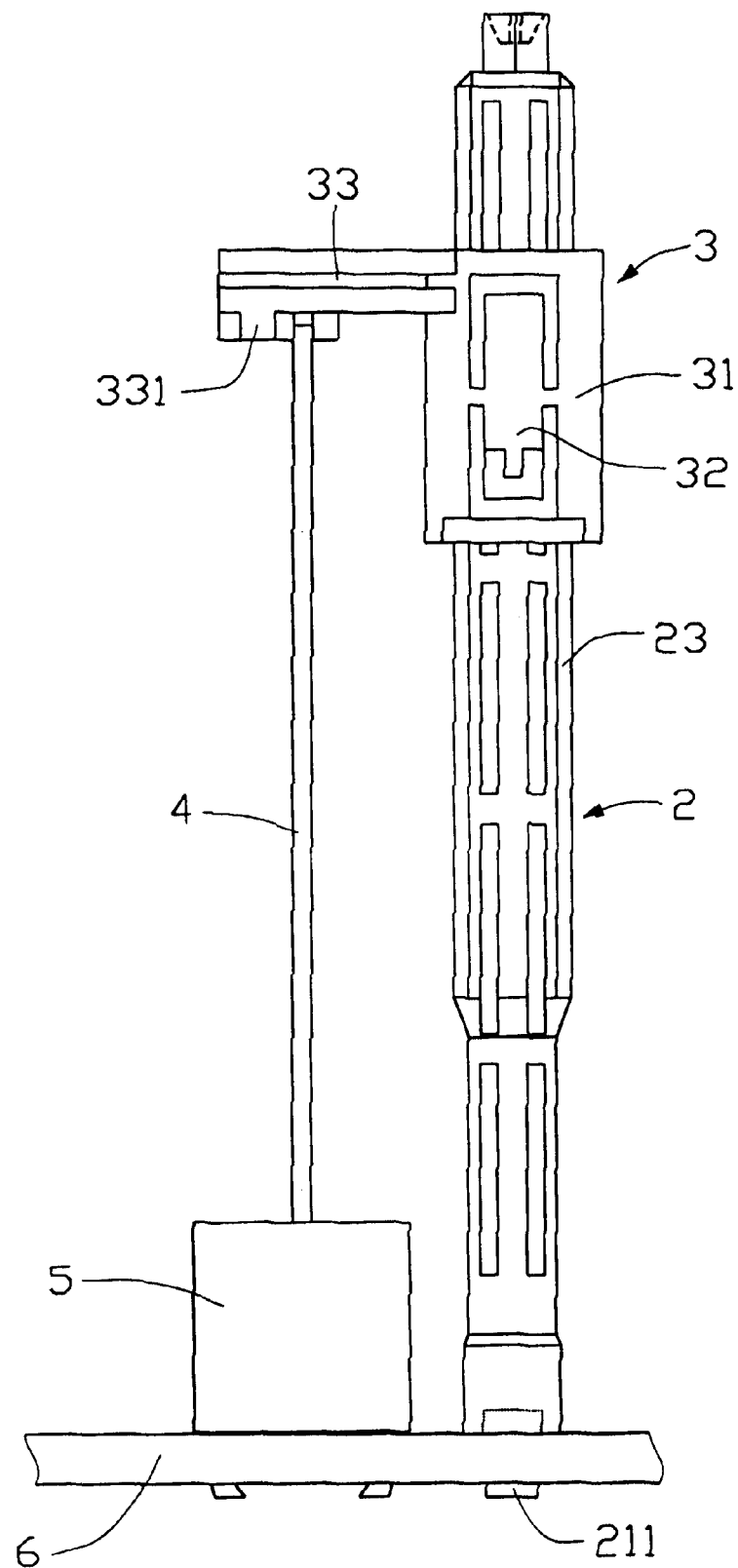
FIG. 12 is a front view of the present invention in use.

Referring to FIGS. 6 to 10, the movable arm 3 includes a canister 31 adapted to enclose and latch with the serrations 23 of the post 2, and a securing portion 33 perpendicularly extending from an outside wall of the canister 31. The securing portion 33 includes a plurality of triangular clamps 331 extending downwardly thereby forming a corresponding number of grooves 331a therebetween to press downwardly against an upper edge of an edge card 4 (as shown in FIG. 12). The canister 31 further defines a pair of rectangular holes 31a on opposite sides thereof. A pair of stoppers 32 is formed in corresponding holes 31a of the canister 31. Each stopper 32 includes a lever 32a extending along the elongated side of the post 2 and two ribs 32b between the lever 32a and the sidewall of the canister 31 for providing the lever 32a a pivot to rotate about. Each lever 32a further forms a pushing end 32c projecting outwardly on one end thereof and a protrusion 32d (see FIG. 10) projecting inwardly on an opposite end thereof.

Figure 11:
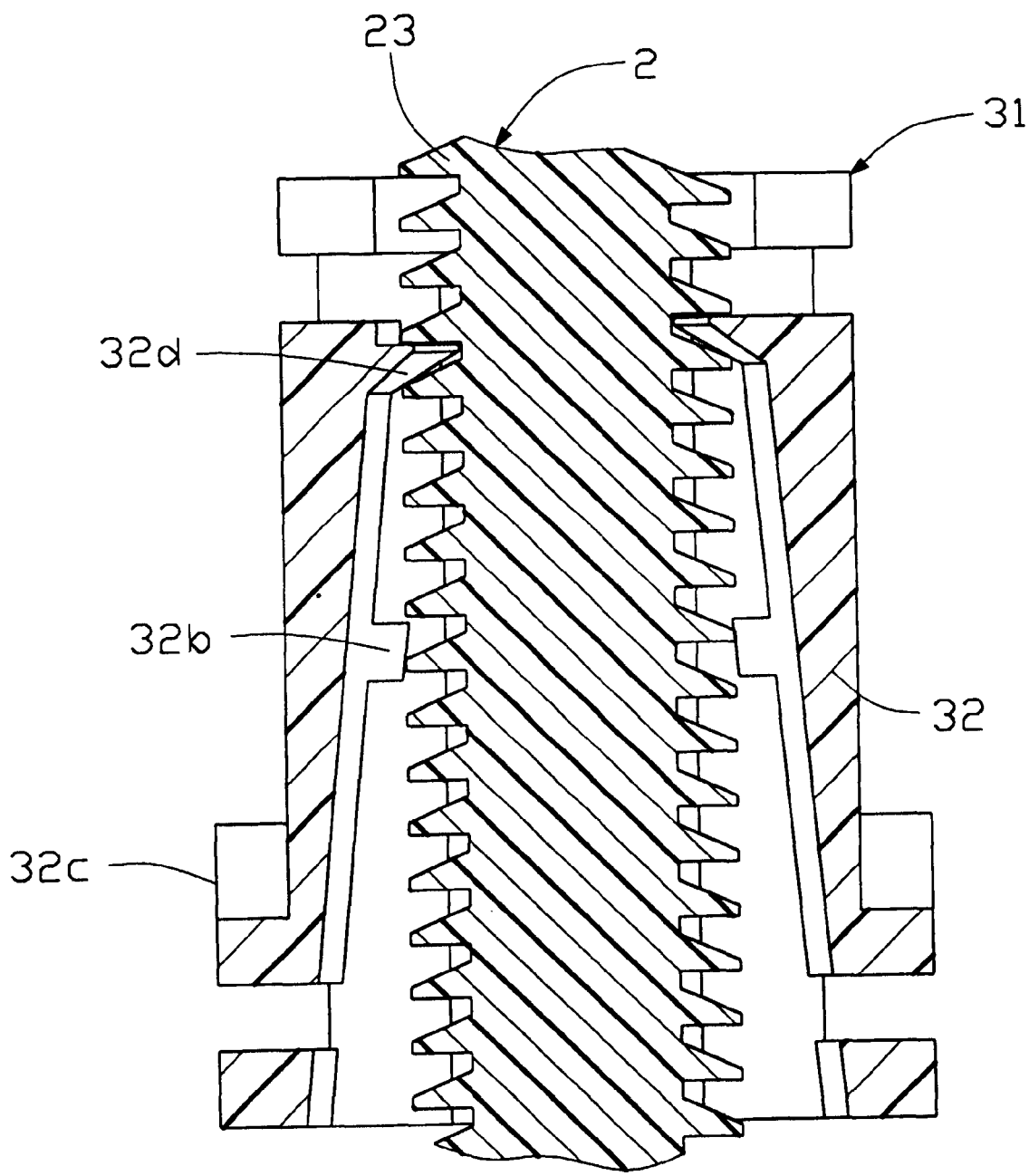
FIG. 11 is a partial cross-sectional view of the present invention.

Referring to FIGS. 11 and 12, in use, the locking portion 211 is screwed into the printed circuit board 6. The lower edge of the edge card 4 is then inserted into a connector 5 secured on the printed circuit board 6. When the pushing ends 32c of the levers 32a are pushed inwardly towards each other, the protrusions 32d move outwardly from between the serrations 23 of the post 2 as the lever 32a pivots about the ribs 32b, allowing the movable arm 3 to freely slide along the elongated side of the post 2 until it reaches a desired height corresponding to the height of the edge card 4. After the upper edge of the edge card 4 is secured in the grooves 331a between the clamps 331, the pushing ends 32c are released, allowing the protrusions 32d to move inwardly, thereby latching with the serrations 23 and securing the edge card 4. To secure different edge card having a different height, simply push the pushing ends 32c inward to move the protrusions 32 outward and slide the movable arm 3 along the elongated side of the post 2 until it reaches a position corresponding to the height of the different edge card. The upper edge of the different edge card 4 is similarly secured by the clamps 331 of the securing portion 33.

A first advantage of the present invention is that the retention mechanism 1 can secure edge cards having different heights by securing the movable arm 3 at different heights. A second advantage of the present invention is that the lower end of the post 2 defines a recess 24 around the locking portion 211 which assures the planarity of the bottom face of the lower end of the post 2, resulting in a square engagement between the bottom face of the post 2 and the printed circuit board 6.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

I claim:

1. A retention mechanism for use with an edge card mounted on a printed circuit board, comprising:

a post including a plurality of serrations formed along an elongated side thereof, and a locking portion attached at a lower end of the post for securing to the printed circuit board;

a movable arm having a canister adapted to enclose and latch with the serrations and a securing portion integrally extending from an outside wall of the canister for clamping the edge card, wherein the canister also forms a pair of opposite stoppers in a side wall of the canister, the stoppers being latchable with the serrations for stopping the movable arm at a set position on the post on which the securing portion presses downwardly against an upper edge of the edge card, thereby securing the edge card on the printed circuit board;

wherein the canister of the movable arm has a pair of rectangular holes on opposite sides thereof, the stoppers being formed in corresponding holes, each stopper including a lever extending along the elongated side of the post and two ribs extending between the lever and the side wall of the canister for providing the lever a pivot to rotate about, each lever forming a pushing end projecting outwardly on one end thereof and a protrusion projecting inwardly on an opposite end thereof, and when the pushing ends are pushed inwardly towards each other, the protrusions move outwardly from between the serrations, and the movable arm can slide along the elongated side of the post freely, and when the pushing ends are released, the protrusions move inwardly to latch with the serrations thereby securing the movable arm at a set position on the post;

wherein the locking portion of the post is a screw made of metal, and is insert-molded within the lower end of the post;

wherein a lower end of the post forms a recess along the longitudinal axis thereof, which has a radius larger than that of the locking portion;

wherein the securing portion includes a plurality of triangular clamps which form plural grooves therebetween to secure an upper edge of the edge card.

2. A retention mechanism for use with an edge card positioned on a printed circuit board, comprising:

a post defining a plurality of serrations thereon, and a mounting portion on a lower portion thereof; and a movable arm including a canister axially movable relative to the post, and a securing portion extending laterally with regard to the canister, said canister including at least a stopper releasably latched with the corresponding serration, said securing portion defining a downward face adapted to downwardly press against a top edge of the edge card;

wherein the stopper includes a lever pivotable with regard to the canister about an axis which is perpendicular to a corresponding diameter of said canister;

wherein a projection is formed around one end of the lever for latchable engagement with the corresponding serration;

wherein said lever defines an inclined inner surface and said projection is formed thereon;

wherein the end of the lever is radially closer to a post than the other end thereof;

wherein said other end defines a pushing end for easily deflecting the lever;

wherein the securing portion defines grooves in the downward face for retaining the card therein.

* * * * *